US 12,113,242 B2

(12) United States Patent
Kageyama et al.

(10) Patent No.: US 12,113,242 B2
(45) Date of Patent: Oct. 8, 2024

(54) POWER STORAGE MODULE

(71) Applicant: PRIME PLANET ENERGY & SOLUTIONS, INC., Tokyo (JP)

(72) Inventors: Takatoshi Kageyama, Kakogawa (JP); Yasumasa Kojima, Kasai (JP); Takashi Inamura, Himeji (JP)

(73) Assignee: Prime Planet Energy & Solutions, Inc., Tokyo (JP)

( * ) Notice: Subject to any disclaimer, the term of this patent is extended or adjusted under 35 U.S.C. 154(b) by 316 days.

(21) Appl. No.: 17/551,426

(22) Filed: Dec. 15, 2021

(65) Prior Publication Data
US 2022/0200088 A1 Jun. 23, 2022

(30) Foreign Application Priority Data

Dec. 21, 2020 (JP) .................. 2020-211173

(51) Int. Cl.
*H01M 50/503* (2021.01)
*H01M 50/284* (2021.01)
*H01M 50/505* (2021.01)
*H01M 50/519* (2021.01)
*H05K 1/11* (2006.01)

(52) U.S. Cl.
CPC ....... *H01M 50/503* (2021.01); *H01M 50/284* (2021.01); *H05K 1/118* (2013.01)

(58) Field of Classification Search
CPC ..... H01M 50/284; H01M 50/05; H05K 1/118
See application file for complete search history.

(56) References Cited

U.S. PATENT DOCUMENTS

| | | |
|---|---|---|
| 2012/0231638 A1 | 9/2012 | Ikeda et al. |
| 2018/0183112 A1 | 6/2018 | Cheong et al. |
| 2019/0181418 A1 | 6/2019 | Son et al. |
| 2020/0020916 A1 | 1/2020 | Takamatsu et al. |
| (Continued) | | |

FOREIGN PATENT DOCUMENTS

| | | | |
|---|---|---|---|
| CN | 205335452 U | * 6/2016 | .......... H01M 10/425 |
| CN | 208127288 U | 11/2018 | |
| (Continued) | | | |

OTHER PUBLICATIONS

Machine translation of CN 205335452 U (Year: 2018).*

*Primary Examiner* — James M Erwin
*Assistant Examiner* — Zackary Richard Cochenour
(74) *Attorney, Agent, or Firm* — Finnegan, Henderson, Farabow, Garrett and Dunner LLP

(57) ABSTRACT

A flexible printed circuit board is placed on a bottom surface portion and has an electric circuit electrically connected to a plurality of power storage cells. A connection terminal is provided on the flexible printed circuit board and is electrically connected to an electrode terminal. The flexible printed circuit board has a main body portion, and a connection piece portion that extends from the main body portion and is curved so as to be connected to the connection terminal. The connection piece portion includes a first straight portion extending straightly in a stacking direction of the power storage cells, and a second straight portion extending in parallel with the first straight portion with a gap being interposed between second straight portion and the first straight portion. The second straight portion is longer than the first straight portion.

10 Claims, 5 Drawing Sheets

(56) References Cited

U.S. PATENT DOCUMENTS

2020/0396830 A1* 12/2020 Yasuda ................. H05K 1/189
2021/0050566 A1     2/2021 Wang et al.
2022/0013868 A1*  1/2022 Takahashi ............. H01M 50/50

FOREIGN PATENT DOCUMENTS

| CN | 110140340 A | 8/2019 | | |
|----|----|----|----|----|
| CN | 111201662 A | 5/2020 | | |
| CN | 112103459 A | 12/2020 | | |
| EP | 3 731 308 A1 | 10/2020 | | |
| JP | S 58-153468 U | 10/1983 | | |
| JP | H 06-140727 A | 5/1994 | | |
| JP | 2011-228216 A | 11/2011 | | |
| JP | 2012-190678 A | 10/2012 | | |
| JP | 2015-022965 A | 2/2015 | | |
| JP | 2015-138604 A | 7/2015 | | |
| JP | 2020-013766 A | 1/2020 | | |
| JP | 2020087665 A | * | 6/2020 | .......... H01M 50/507 |
| WO | WO 2018/117567 A1 | 6/2018 | | |

* cited by examiner

POWER STORAGE MODULE

This nonprovisional application is based on Japanese Patent Application No. 2020-211173 filed on Dec. 21, 2020, with the Japan Patent Office, the entire contents of which are hereby incorporated by reference.

BACKGROUND OF THE INVENTION

Field of the Invention

The present technology relates to a power storage module.

Description of the Background Art

Japanese Utility Model Laying-Open No. 58-153468 is a prior art document that discloses a configuration of a flexible printed circuit board. In the flexible printed circuit board described in Japanese Utility Model Laying-Open No. 58-153468, a connection piece portion having straight extension portions having the same length are formed to extend in a meandering manner, the connection piece portion being provided with a conductor that connects a connection target component and a circuit pattern of the flexible printed circuit board to each other.

An efficient layout is required for the connection piece portion of the flexible printed circuit board to attain a small occupied area while securing a required fatigue life against stress generated in the event of vibration. Since the connection piece portion of the flexible printed circuit board described in Japanese Utility Model Laying-Open No. 58-153468 is constituted of the straight extension portions having the same length, there is room for attaining an efficient layout by attaining a small occupied area.

SUMMARY OF THE INVENTION

An object of the present technology is to provide a power storage module in which an efficient layout can be attained in a connection piece portion of a flexible printed circuit board by attaining a small occupied area while securing a required fatigue life against stress generated in the event of vibration.

A power storage module according to the present technology includes a stack, a resin plate, a flexible printed circuit board, and a connection terminal. In the stack, a plurality of power storage cells each including an electrode terminal are stacked in a stacking direction. The resin plate has a bottom surface portion extending in each of the stacking direction and a width direction orthogonal to the stacking direction, and is placed on the stack. The flexible printed circuit board is placed on the bottom portion, and has an electric circuit electrically connected to the plurality of power storage cells. The connection terminal is provided on the flexible printed circuit board and is electrically connected to the electrode terminal. The flexible printed circuit board has a main body portion, and a connection piece portion that extends from the main body portion and is curved so as to be connected to the connection terminal. The connection piece portion includes a first straight portion extending straightly in the stacking direction, and a second straight portion extending in parallel with the first straight portion with a gap being interposed between the second straight portion and the first straight portion. The second straight portion is longer than the first straight portion.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
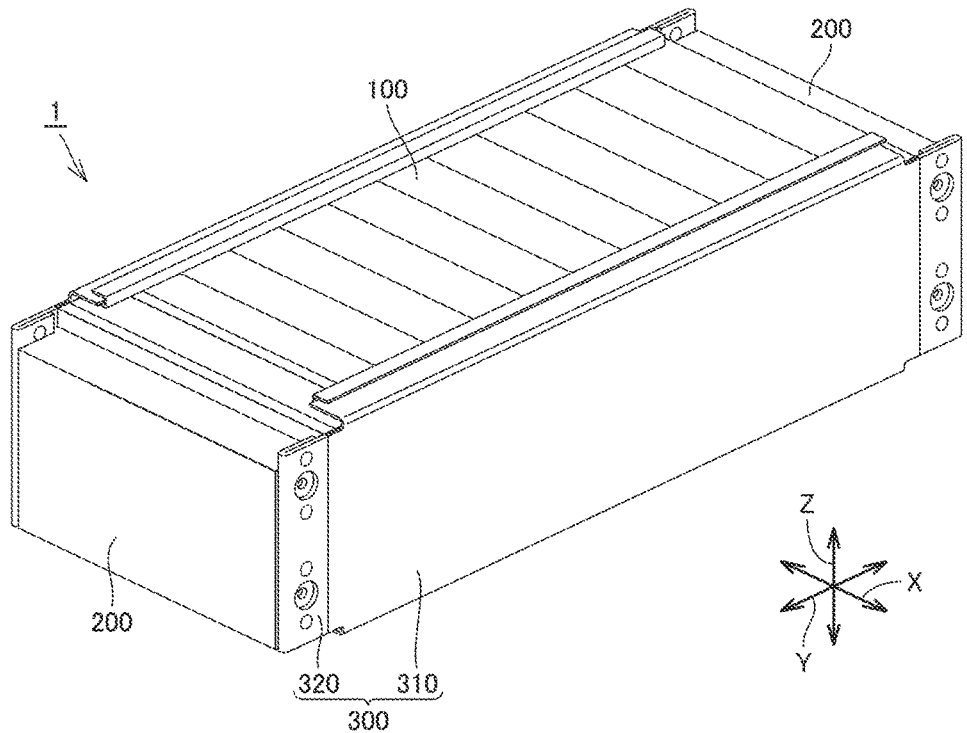
FIG. 1 is a diagram showing a basic configuration of a battery pack.

Hereinafter, embodiments of the present technology will be described. It should be noted that the same or corresponding portions are denoted by the same reference characters, and may not be described repeatedly.

It should be noted that in the embodiments described below, when reference is made to number, amount, and the like, the scope of the present technology is not necessarily limited to the number, amount, and the like unless otherwise stated particularly. Further, in the embodiments described below, each component is not necessarily essential to the present technology unless otherwise stated particularly.

It should be noted that in the present specification, the terms "comprise", "include", and "have" are open-end terms. That is, when a certain configuration is included, a configuration other than the foregoing configuration may or may not be included. Further, the present technology is not limited to one that necessarily exhibits all the functions and effects stated in the present embodiment.

In the present specification, the term "battery" is not limited to a lithium ion battery, and may include another battery such as a nickel-metal hydride battery. In the present specification, the term "electrode" may collectively represent a positive electrode and a negative electrode. Further, the term "electrode plate" may collectively represent a positive electrode plate and a negative electrode plate.

In the present specification, the "power storage cell" or the "power storage module" is not limited to a battery cell or a battery module, and may include a capacitor cell or a capacitor module.

Figure 2:
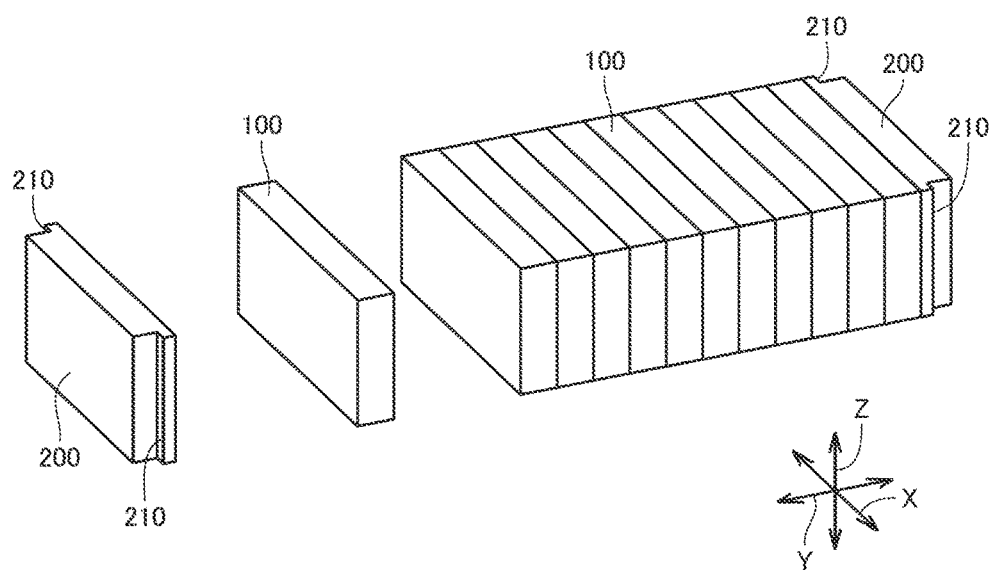
FIG. 2 is a diagram showing battery cells and end plates in the battery pack shown in FIG. 1.

FIG. 1 is a diagram showing a basic configuration of a battery pack 1. FIG. 2 is a diagram showing battery cells 100 and end plates 200 included in battery pack 1.

As shown in FIGS. 1 and 2, battery pack 1, which serves as an exemplary "power storage module", includes battery cells 100, end plates 200, and a restraint member 300. The plurality of battery cells 100 are provided side by side in a Y axis direction (arrangement direction). Thus, a stack of battery cells 100 is formed. A separator (not shown) is interposed between the plurality of battery cells 100. The plurality of battery cells 100, which are sandwiched between two end plates 200, are pressed by end plates 200, and are therefore restrained between two end plates 200.

End plates 200 are disposed beside both ends of battery pack 1 in the Y axis direction. Each of end plates 200 is fixed to a base such as a case that accommodates battery pack 1. Stepped portions 210 are formed at both ends of end plate 200 in an X axis direction (width direction).

Restraint member 300 connects two end plates 200 to each other. Restraint member 300 is attached to stepped portions 210 formed on two end plates 200.

Restraint member 300 is engaged with end plates 200 with compression force in the Y axis direction being exerted to the stack of the plurality of battery cells 100 and end plates 200, and then the compression force is released, with the result that tensile force acts on restraint member 300 that connects two end plates 200 to each other. As a reaction thereto, restraint member 300 presses two end plates 200 in directions of bringing them closer to each other.

Restraint member 300 includes a first member 310 and a second member 320. First member 310 and second member 320 are coupled to each other by butt welding, for example. Tip surfaces formed by folding second member 320 are brought into abutment with stepped portions 210 of end plate 200 in the Y axis direction.

Figure 3:
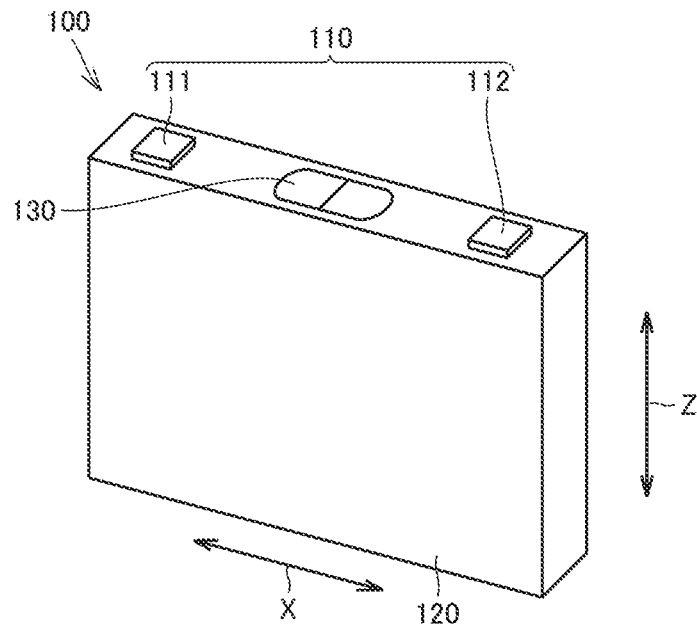
FIG. 3 is a diagram showing a battery cell in the battery pack shown in FIG. 1.

FIG. 3 is a diagram showing battery cell 100 in battery pack 1. As shown in FIG. 3, battery cell 100 includes an electrode terminal 110, a housing 120, and a gas discharge valve 130.

Electrode terminal 110 includes a positive electrode terminal 111 and a negative electrode terminal 112. Electrode terminal 110 is formed on housing 120. Housing 120 is formed to have a substantially rectangular parallelepiped shape. An electrode assembly (not shown) and an electrolyte solution (not shown) are accommodated in housing 120. Gas discharge valve 130 is fractured when pressure inside housing 120 becomes equal to or more than a predetermined value. Thus, gas in housing 120 is discharged to the outside of housing 120.

Figure 4:
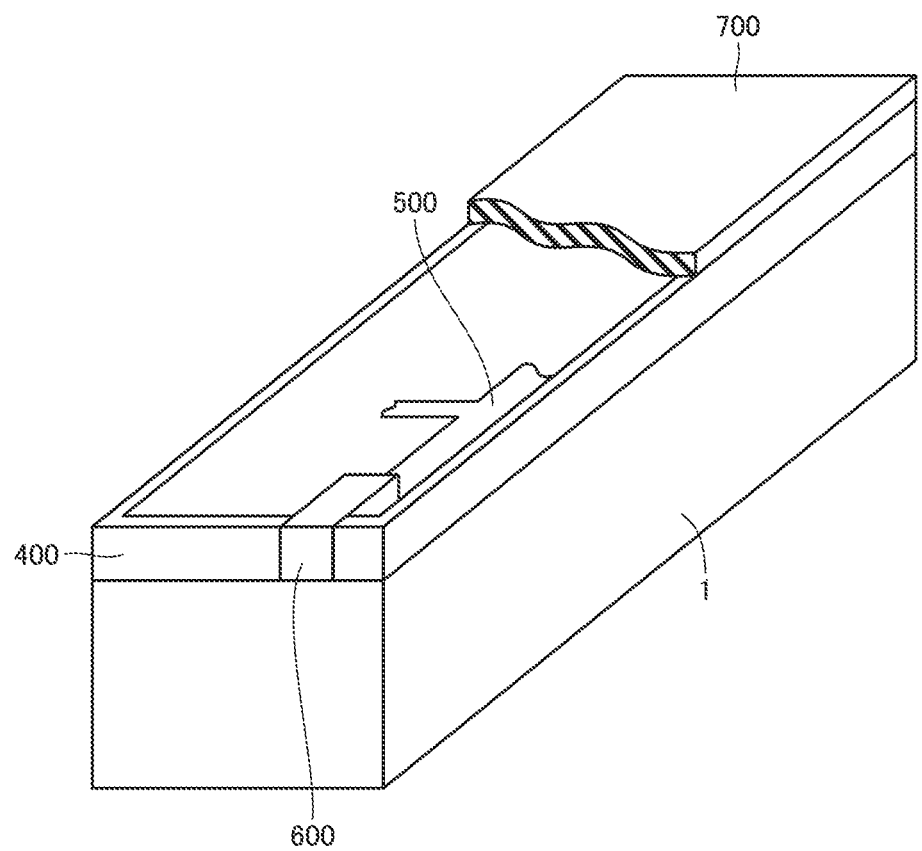
FIG. 4 is a perspective view showing a state in which a wiring module is provided on the battery pack.

FIG. 4 is a perspective view showing a state in which a wiring module is provided on battery pack 1. As shown in FIG. 4, a plate member 400 is placed on battery pack 1, and a flexible printed circuit board 500 is provided on plate member 400. Flexible printed circuit board 500 can be electrically connected to an external device via a connector 600. A cover member 700 is provided on plate member 400 so as to cover flexible printed circuit board 500.

Figure 5:
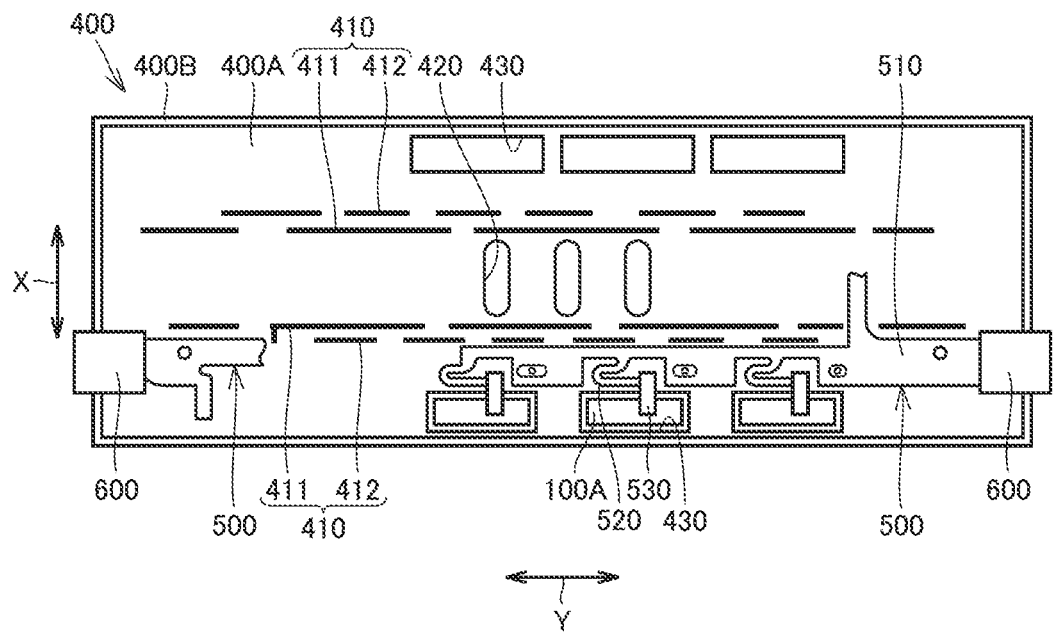
FIG. 5 is a schematic top view of the wiring module placed on the battery pack.

FIG. 5 is a schematic top view of the wiring module placed on battery pack 1. As shown in FIG. 5, the wiring module includes plate member 400, flexible printed circuit board 500, and connector 600.

Plate member 400 (bus bar plate) is a resin plate having insulation property and heat resistance. Plate member 400 has: a bottom surface portion 400A extending in each of the X axis direction and the Y axis direction; and a side surface portion 400B formed to extend upward from bottom surface portion 400A in a Z axis direction. Plate member 400 is provided with a wall portion 410, and openings 420, 430.

Wall portion 410 is formed to extend upward from bottom surface portion 400A of plate member 400 in the Z axis direction. Wall portion 410 includes: a first wall portion 411 formed on the center side in the X axis direction; and a second wall portion 412 provided on the outer side in the X axis direction in parallel with first wall portion 411. Each of first wall portion 411 and second wall portion 412 is formed to extend discontinuously in the Y axis direction.

Each of first wall portion 411 and second wall portion 412 can serve as a protection wall that prevents sparking generated in plate member 400 from being directly exposed to outside while securing a path for discharging, to the outside of the battery pack, the gas discharged from housing 120 of battery cell 100.

Each of openings 420 is located above gas discharge valve 130 of battery cell 100. Each of openings 430 is located above electrode terminal 110 of battery cell 100.

Flexible printed circuit board 500 is placed on bottom surface portion 400A of plate member 400. Flexible printed circuit board 500 is a board in which an electric circuit is formed on a base member including a base film having an insulation property and a conductive metal foil. The base film is composed of, for example, polyimide or the like. The conductive metal foil is composed of, for example, a copper foil or the like. Flexible printed circuit board 500 has flexibility and has such a characteristic that the electric characteristics of flexible printed circuit board 500 are maintained even when deformed.

A connection terminal 530 electrically connected to electrode terminal 110 is provided on flexible printed circuit board 500. Connection terminal 530 is joined to a bus bar 100A that couples electrode terminals 110 of the plurality of battery cells 100. Thus, the electric circuit provided on flexible printed circuit board 500 and battery pack 1 are electrically connected to each other.

Connector 600 is fixed to flexible printed circuit board 500. The electric circuit in flexible printed circuit board 500 and an external electric device can be electrically connected to each other via connector 600.

Figure 6:
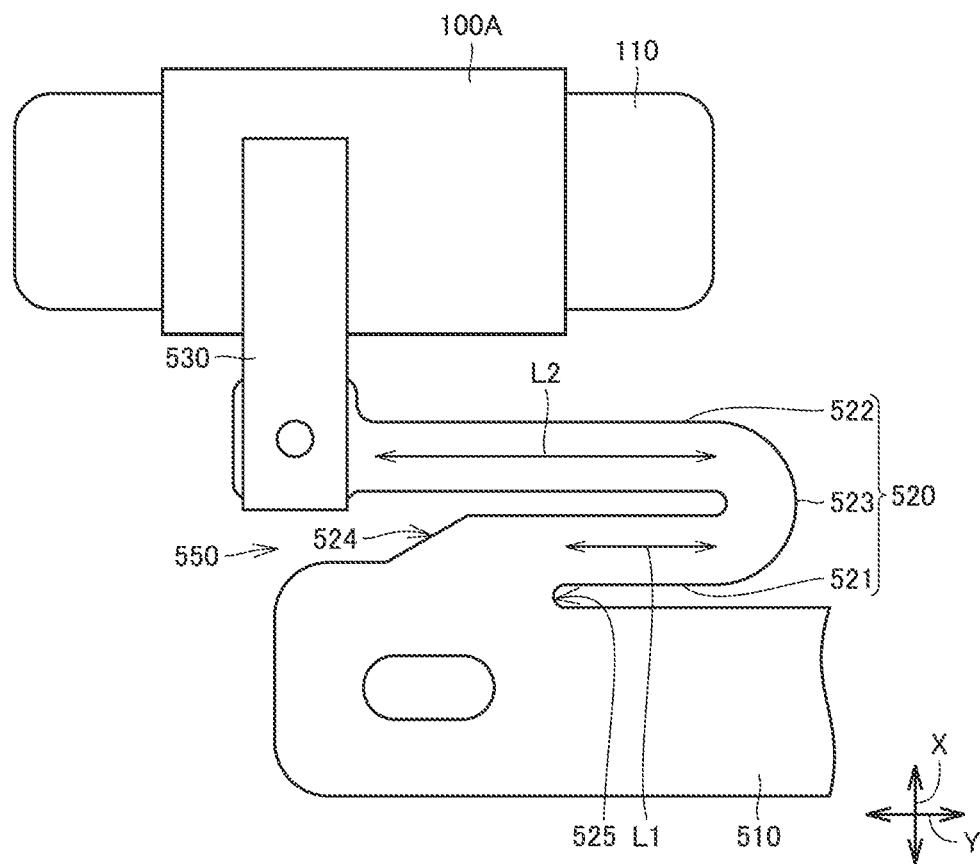
FIG. 6 is an enlarged partial top view showing surroundings of a connection piece portion of a flexible printed circuit board and a connection terminal.

FIG. 6 is an enlarged partial top view showing surroundings of a connection piece portion of the flexible printed circuit board and the connection terminal. As shown in FIGS. 5 and 6, flexible printed circuit board 500 includes a main body portion 510 and a connection piece portion 520.

Connection piece portion 520 extends from main body portion 510 and is curved to have a substantially U-shape. Specifically, connection piece portion 520 extends from an end edge of main body portion 510 in the X axis direction. However, connection piece portion 520 may extend from an end edge of main body portion 510 in the Y axis direction. Connection piece portion 520 includes: a first straight portion 521 extending straightly in the Y axis direction; and a second straight portion 522 extending in parallel with first straight portion 521 with a gap being interposed between second straight portion 522 and first straight portion 521. Each of first straight portion 521 and second straight portion 522 has a certain width and extends straightly. First straight portion 521 and second straight portion 522 are connected to each other by a semi-arc portion 523. In the present embodiment, first straight portion 521 is located on the main body portion side with respect to second straight portion 522. First straight portion 521 extends in parallel with main body portion 510 with a gap being interposed between first straight portion 521 and main body portion 510.

An outer edge 524 of a root portion of connection piece portion 520 extends to have an obtuse interior angle with respect to a portion of an end edge of main body portion 510, and is connected to the portion of the end edge. An inner edge 525 of the root portion of connection piece portion 520 has a semi-arc shape, and is connected to another portion of the end edge of main body portion 510. Connection terminal 530 is connected to the tip of connection piece portion 520.

The tip portion of connection piece portion 520 connected to connection terminal 530 is not included in the straight portion. Length L2 of second straight portion 522 is longer than length L1 of first straight portion 521. A space 550 is formed by first straight portion 521 being shorter than second straight portion 522. A portion of connection terminal 530 is located in space 550. Since first straight portion 521 is thus shorter than second straight portion 522, the occupied area of connection piece portion 520 can be made small, thereby attaining an efficient layout. It should be noted that the efficient layout may be attained by disposing another member in space 550.

If first straight portion 521 has the same length as that of second straight portion 522, no space 550 is formed. In this case, a space for disposing a portion of connection terminal 530 therein is additionally required, with the result that the layout cannot be efficient.

Figure 7:
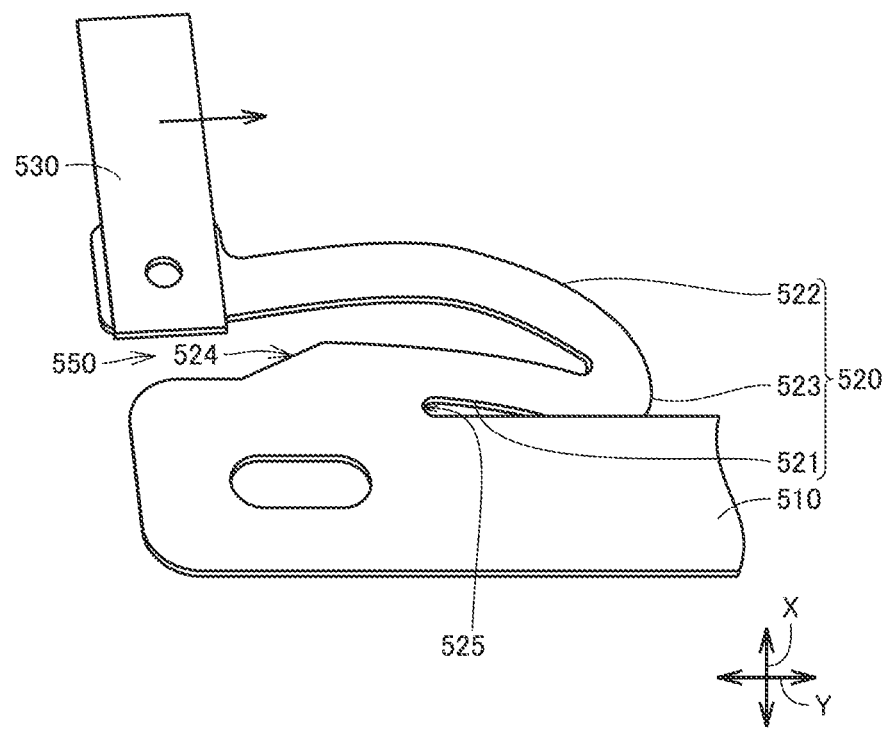
FIG. 7 is a partial top view showing a deformed state of the connection piece portion when the connection terminal is displaced to one side in a Y axis direction.
Figure 8:
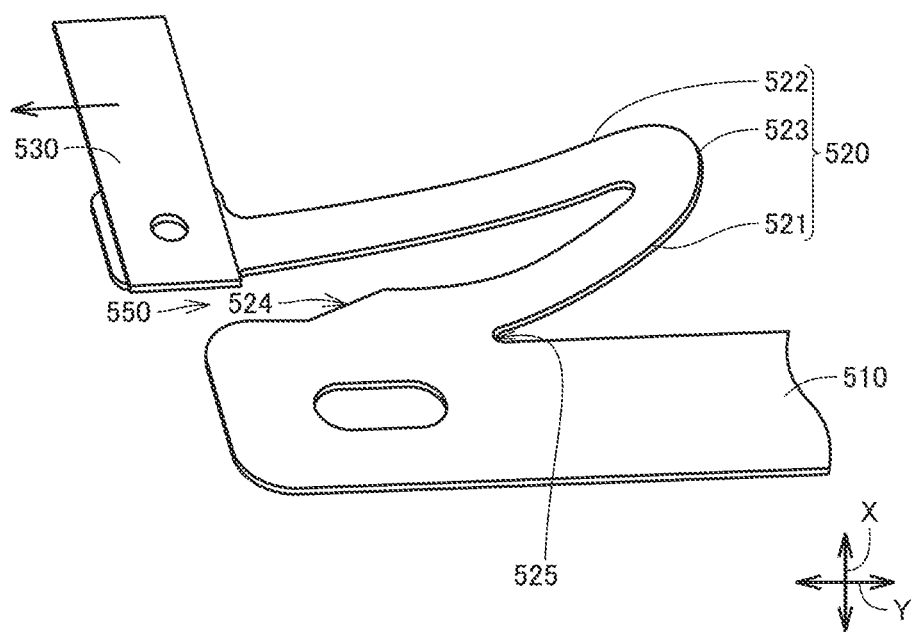
FIG. 8 is a partial top view showing a deformed state of the connection piece portion when the connection terminal is displaced to the other side in the Y axis direction.

Displacements (in the X axis direction, the Y axis direction, and the Z axis direction) of connection terminal 530 can be absorbed by connection piece portion 520. FIG. 7 is a partial top view showing a deformed state of the connection piece portion when the connection terminal is displaced to one side in the Y axis direction. FIG. 8 is a partial top view showing a deformed state of the connection piece portion when the connection terminal is displaced to the other side in the Y axis direction.

As shown in FIG. 7, when connection terminal 530 is displaced to one side in the Y axis direction, second straight portion 522 is bent more greatly than first straight portion 521. As shown in FIG. 8, when connection terminal 530 is displaced to the other side in the Y axis direction, first straight portion 521 is bent more greatly than second straight portion 522. Respective positions of the bent portions of first straight portion 521 and second straight portion 522 when connection terminal 530 is displaced to one side in the Y axis direction are different from respective positions of the bent portions of first straight portion 521 and second straight portion 522 when connection terminal 530 is displaced to the other side in the Y axis direction. Thus, stress is generated at the distributed positions in the event of vibration of connection piece portion 520, thereby attaining a long fatigue life against the stress generated in the event of vibration of connection piece portion 520.

Figure 9:
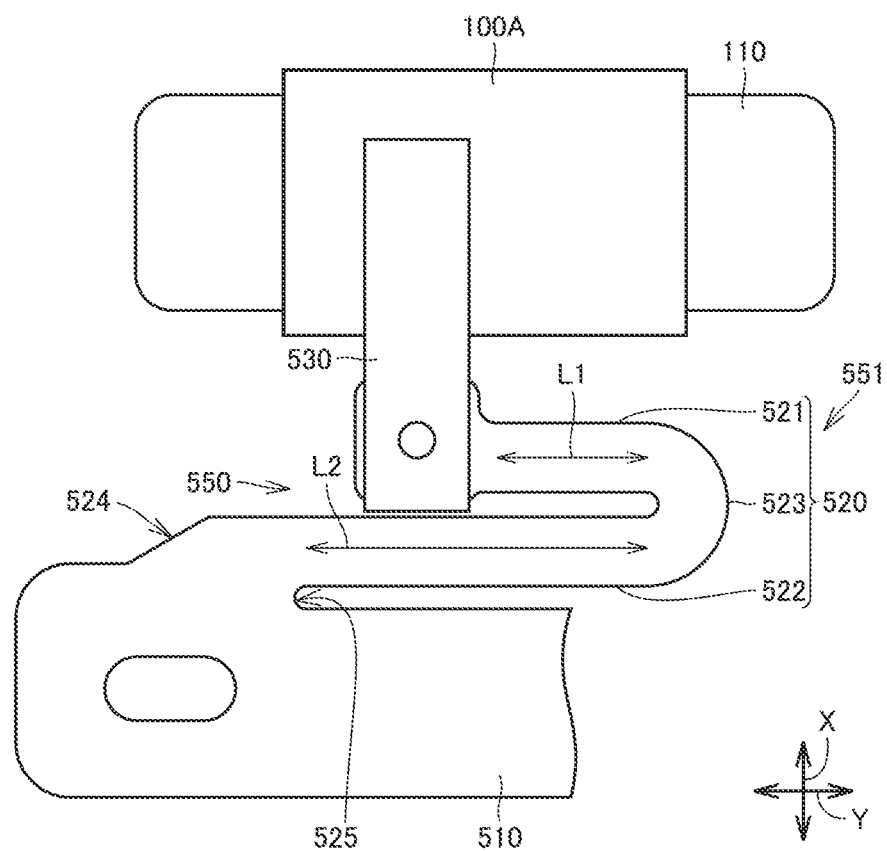
FIG. 9 is an enlarged partial top view showing surroundings of a connection piece portion of a flexible printed circuit board and a connection terminal according to a modification.

FIG. 9 is an enlarged partial top view showing surroundings of a connection piece portion of a flexible printed circuit board and a connection terminal according to a modification. As shown in FIG. 9, in the modification, second straight portion 522 is located on the main body portion side with respect to first straight portion 521. Also in this case, since first straight portion 521 is shorter than second straight portion 522, stress is generated at distributed positions in the event of vibration of connection piece portion 520, thereby attaining a long fatigue life against the stress generated in the event of vibration of connection piece portion 520. Further, since the tip of semi-arc portion 523 is located at a position on the inner side with respect to the tip of electrode terminal 110 in the Y axis direction as compared with the embodiment shown in FIG. 6, a member or the like with regard to the power storage module can be also disposed in a space 551 resulting from this positional relation.

In the power storage module according to the present embodiment, flexible printed circuit board 500 has: main body portion 510; and connection piece portion 520 that extends from main body portion 510 and is curved so as to be connected to connection terminal 530. Connection piece portion 520 includes: first straight portion 521 straightly extending in the stacking direction of battery cells 100; and second straight portion 522 extending in parallel with first straight portion 521 with a gap being interposed between second straight portion 522 and first straight portion 521. Second straight portion 522 is longer than first straight portion 521. Thus, the occupied area of connection piece portion 520 can be made small while securing a required fatigue life against stress generated in the event of vibration in connection piece portion 520, thereby attaining an efficient layout.

In the power storage module according to the present embodiment, first straight portion 521 and second straight portion 522 are connected to each other by semi-arc portion 523. Thus, stress generated in semi-arc portion 523 in the event of bending of connection piece portion 520 can be distributed. This results in a long fatigue life against the stress generated in the event of vibration of connection piece portion 520.

In the power storage module according to the present embodiment, outer edge 524 of the root portion of connection piece portion 520 extends to have an obtuse interior angle with respect to the edge of main body portion 510, and inner edge 525 of the root portion of connection piece portion 520 has a semi-arc shape. Thus, stress generated at the root portion of connection piece portion 520 in the event of bending of connection piece portion 520 can be distributed. This results in a long fatigue life against the stress generated in the event of vibration of connection piece portion 520.

Although the embodiments of the present invention have been described and illustrated in detail, it is clearly understood that the same is by way of illustration and example only and is not to be taken by way of limitation, the scope of the present invention being interpreted by the terms of the appended claims.

What is claimed is:
1. A power storage module comprising:
a stack in which a plurality of power storage cells each including an electrode terminal are stacked in a stacking direction;
a resin plate having a bottom surface portion extending in each of the stacking direction and a width direction orthogonal to the stacking direction, the resin plate being placed on the stack;
a flexible printed circuit board placed on the bottom surface portion and having an electric circuit electrically connected to the plurality of power storage cells; and
a connection terminal provided on the flexible printed circuit board and electrically connected to the electrode terminal, wherein
the flexible printed circuit board has a main body portion, and a connection piece portion that extends from the main body portion and is curved so as to be connected to the connection terminal,
the connection piece portion includes a first straight portion extending straightly in the stacking direction, and a second straight portion extending in parallel with the first straight portion with a gap being interposed between the second straight portion and the first straight portion,
the second straight portion is longer than the first straight portion,
an outer edge of a root portion of the connection piece portion is connected to a portion of an end edge of the main body portion, and forms an obtuse interior angle where the outer edge of the root portion of the con- nection piece portion is connected to the portion of the end edge of the main body portion, an inner edge of the root portion of the connection piece portion is connected to another portion of the end edge of the main body portion, and has a semi-arc shape where the inner edge of the root portion of the connection piece portion is connected to the another portion of the end edge of the main body portion, and the portion of the end edge of the main body portion extends in parallel with the first straight portion, and the another portion of the end edge of the main body portion extends in parallel with the first straight portion.

2. The power storage module according to claim 1, wherein the first straight portion and the second straight portion are connected to each other by a semi-arc portion.

3. The power storage module according to claim 1, wherein the first straight portion is located on the main body portion side with respect to the second straight portion.

4. The power storage module according to claim 2, wherein the first straight portion is located on the main body portion side with respect to the second straight portion.

5. The power storage module according to claim 1, wherein the second straight portion is located on the main body portion side with respect to the first straight portion.

6. The power storage module according to claim 2, wherein the second straight portion is located on the main body portion side with respect to the first straight portion.

7. The power storage module according to claim 1, wherein a portion of the connection terminal is located in a space formed by the first straight portion being shorter than the second straight portion.

8. The power storage module according to claim 2, wherein a portion of the connection terminal is located in a space formed by the first straight portion being shorter than the second straight portion.

9. The power storage module according to claim 3, wherein a portion of the connection terminal is located in a space formed by the first straight portion being shorter than the second straight portion.

10. The power storage module according to claim 4, wherein a portion of the connection terminal is located in a space formed by the first straight portion being shorter than the second straight portion.

* * * * *